(12) United States Patent
Wong et al.

(10) Patent No.: US 8,008,934 B2
(45) Date of Patent: Aug. 30, 2011

(54) BURN-IN SYSTEM FOR ELECTRONIC DEVICES

(75) Inventors: Wei Ping Wong, Subang Jaya (MY);
Chee Keong Chiew, Puchong (MY);
Kok Hua Lee, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 206 days.

(21) Appl. No.: 12/481,592

(22) Filed: Jun. 10, 2009

(65) Prior Publication Data

US 2010/0315109 A1 Dec. 16, 2010

(51) Int. Cl.
*G01R 31/10* (2006.01)

(52) U.S. Cl. ......... 324/750.05; 324/750.07; 324/750.08; 324/750.03; 324/750.06

(58) Field of Classification Search ............... 324/750.08
See application file for complete search history.

(56) References Cited

U.S. PATENT DOCUMENTS

| | | | |
|---|---|---|---|
| 4,787,752 A * | 11/1988 | Fraser et al. ............. | 374/45 |
| 4,848,090 A * | 7/1989 | Peters ....................... | 62/3.3 |
| 4,881,591 A * | 11/1989 | Rignall .................... | 165/206 |
| 5,359,285 A | 10/1994 | Hashinaga et al. | |
| 5,406,212 A | 4/1995 | Hashinaga et al. | |
| 5,414,370 A * | 5/1995 | Hashinaga et al. ...... | 324/750.07 |
| 6,114,868 A * | 9/2000 | Nevill ...................... | 324/750.08 |
| 6,323,665 B1 | 11/2001 | Johnson et al. | |
| 6,504,392 B2 * | 1/2003 | Fredeman et al. ....... | 324/750.05 |
| 6,744,269 B1 | 6/2004 | Johnson et al. | |
| 6,842,030 B2 * | 1/2005 | Kim et al. ................ | 324/750.03 |
| 7,023,229 B2 * | 4/2006 | Maesaki et al. ......... | 324/750.07 |
| 2003/0155939 A1* | 8/2003 | Lutz et al. ................ | 324/760 |
| 2007/0152684 A1* | 7/2007 | Lee et al. ................. | 324/753 |
| 2009/0102499 A1* | 4/2009 | Segawa et al. .......... | 324/760 |

\* cited by examiner

*Primary Examiner* — Huy Q Phan
*Assistant Examiner* — Richard Isla Rodas
(74) *Attorney, Agent, or Firm* — Charles Bergere

(57) ABSTRACT

A burn-in system (10) includes an enclosure (12) defining a burn-in chamber (14). The enclosure (12) is configured to be mounted on a burn-in board (34) over a burn-in socket (36). A heating element (16) is configured to generate heat within the burn-in chamber (14) and a temperature sensor (18) is configured to sense a temperature within the burn-in chamber (14). An opening (24) is formed in the enclosure (12) for receiving a fluid (26). A controller (20) is configured to control the heating element (16) and fluid flow into the enclosure (12) in response to the temperature sensed by the temperature sensor (18).

14 Claims, 3 Drawing Sheets

BURN-IN SYSTEM FOR ELECTRONIC DEVICES

BACKGROUND OF THE INVENTION

The present invention relates to burn-in testing and more particularly to a burn-in system for performing burn-in testing.

Burn-in testing in a conventional burn-in oven suffers a number of drawbacks. One such drawback is burn-in yield loss as the heated environment in the conventional burn-in oven raises the white noise level of passive components on a burn-in board, causing Devices Under Test (DUTs) to randomly fall out of code execution during burn-in testing. Consequently, first-pass yield losses can be substantial. Capacity requirements are increased and time is wasted by having to repeat the burn-in test.

Another limitation is the effect of burn-in testing on the life span of a burn-in board. Burn-in board hardware suffers degradation due to heat acceleration during burn-in testing. This reduces the lifespan of the burn-in board.

Additionally, because the entire burn-in board is placed in a burn-in oven during burn-in testing, access to test points on the burn-in board for data collection and analysis is severely restricted. This impedes signal tapping.

In view of the foregoing, it would be desirable to have a burn-in system that provides improved first-pass yields, reduces burn-in board degradation and allows for easy signal tapping.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 1:
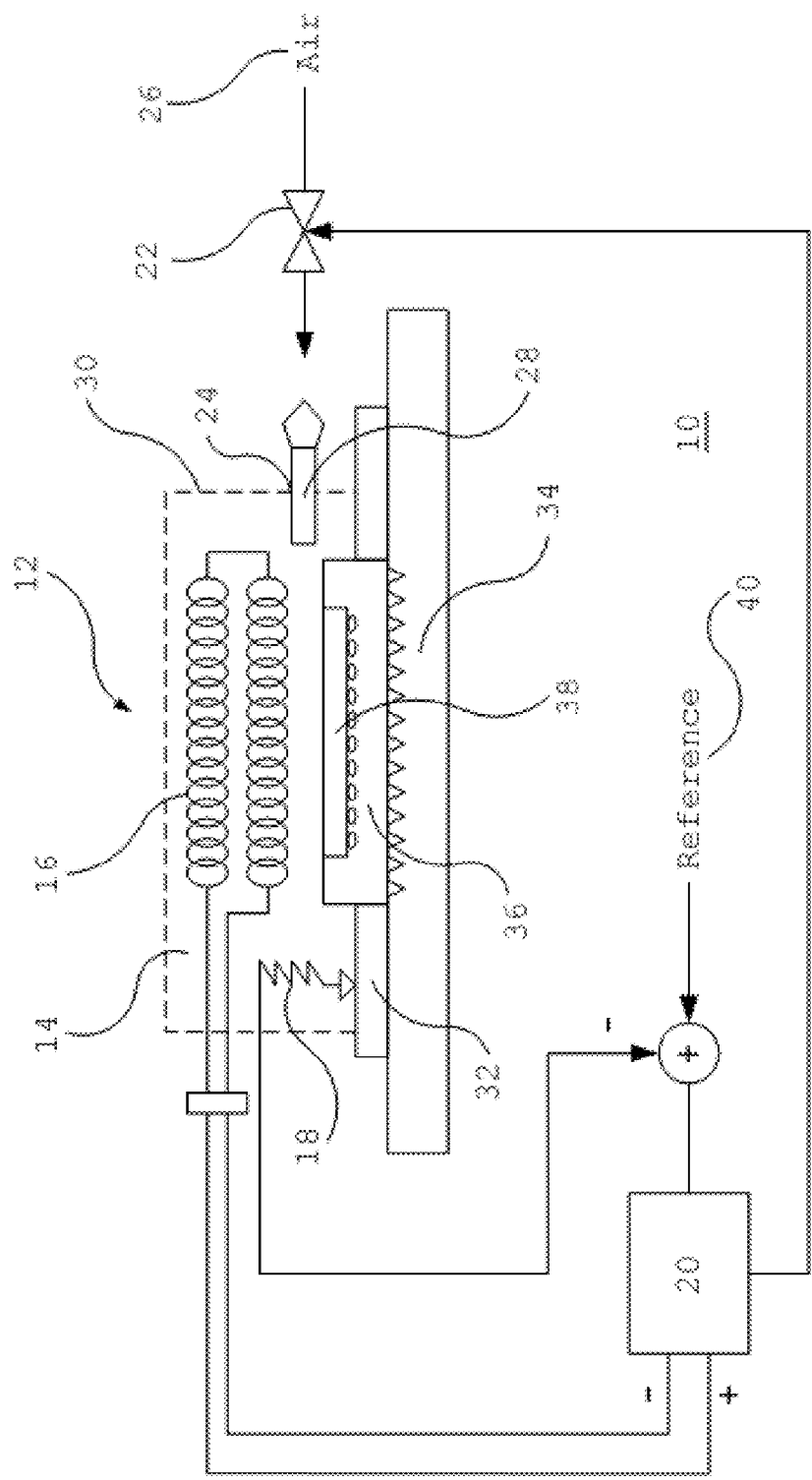
FIG. 1 is a schematic block diagram of a burn-in system in accordance with an embodiment of the present invention.

The detailed description set forth below in connection with the appended drawings is intended as a description of presently preferred embodiments of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

The present invention provides a burn-in system including an enclosure defining a burn-in chamber. The enclosure is configured to be mounted on a burn-in board over a burn-in socket. A heating element is configured to generate heat within the burn-in chamber and a temperature sensor is configured to sense a temperature within the burn-in chamber. An opening is formed in the enclosure for receiving a fluid. A controller is configured to control the heating element and fluid flow into the enclosure in response to the temperature sensed by the temperature sensor.

The present invention also provides a burn-in apparatus including an enclosure defining a burn-in chamber. The enclosure includes a housing coupled to a base. The base is configured to be mounted on a burn-in board and to fit around a periphery of a burn-in socket. A heating element is configured to generate heat within the burn-in chamber and a temperature sensor is configured to sense a temperature within the burn-in chamber. An opening is formed in the enclosure for receiving a fluid. A controller is configured to control the heating element and fluid flow into the enclosure in response to the temperature sensed by the temperature sensor.

The present invention further provides a burn-in oven including an enclosure defining a burn-in chamber. The enclosure is configured to be mounted on a burn-in board over a burn-in socket. A heating element is configured to generate heat within the burn-in chamber and a temperature sensor is configured to sense a temperature within the burn-in chamber. An opening is formed in the enclosure for receiving a fluid. A controller is configured to control the heating element and fluid flow into the enclosure in response to the temperature sensed by the temperature sensor.

Referring now to FIG. 1, a burn-in system 10 is shown. The burn-in system 10 includes an enclosure 12 defining a burn-in chamber 14, a heating element 16 within the burn-in chamber 14, a temperature sensor 18 within the burn-in chamber 14, and a controller 20 external of the burn-in chamber 14 and being coupled to a valve 22 also external of the burn-in chamber 14. The heating element 16 and/or the temperature sensor 18 may be mounted to the enclosure 12. An opening 24 is formed in the enclosure 12 for receiving a fluid 26. In the embodiment shown, a nozzle 28 is disposed in the opening 24. The enclosure 12 comprises a housing 30 coupled to a base 32, and is configured to be mounted on a burn-in board 34 over a burn-in socket 36. A device under test (DUT) 38 is received in the burn-in socket 36.

During a burn-in test, the DUT 38, together with the burn-in socket 36 in the embodiment shown, is encapsulated by the enclosure 12 to create a burn-in environment topically or locally around the burn-in socket 36. Accordingly, heat generated during the burn-in test is confined to a dedicated area on the burn-in board 34. Consequently, other parts of the burn-in board 34 and other electronic components on the burn-in board 34 are not exposed to the heat generated during the burn-in test. This lengthens the life span of the burn-in board 34 and reduces or eliminates white noise from passive components on the other parts of the burn-in board 34. The latter resolves the issue of code execution failure and improves the burn-in yield on first pass. Additionally, since burn-in testing is confined to a specific area on the burn-in board 34 with the burn-in system 10, signal tapping for data collection and analysis may be concurrently performed via test points located on other areas of the burn-in board 34.

In a preferred embodiment, the enclosure 12 is detachably mounted to the burn-in board 30. This allows use of the burn-in system 10 with multiple individual burn-in sockets on the same or a different burn-in board simply by removing the enclosure 12 after a burn-in test and mounting the enclosure 12 over another burn-in socket on the same or a different burn-in board.

The heating element 16 is configured to generate heat within the burn-in chamber 14. The heating element 16 may be any known heating element and may be mounted in the burn-in chamber 14 in a known manner.

The temperature sensor 18 is configured to sense a temperature within the burn-in chamber 14. The sensed temperature is fed back to the controller 20. The temperature sensor 18 may comprise a resistive temperature sensor or any other suitable temperature sensing device. The burn-in system 10 can also include more than one temperature sensor 18 within the enclosure 12 in order to cover larger sensing area (including the DUT's package temperature).

The controller 20 is configured to control the heating element 16 and fluid flow into the enclosure 12 in response to the temperature sensed by the temperature sensor 18. More particularly, the controller 20 compares the sensed temperature fed back from the temperature sensor 18 to a reference temperature value 40 and adjusts the heat output of the heating element 16 and the fluid flow rate into the enclosure 12 through the valve 22 accordingly to achieve a desired temperature setting. Accordingly, an ambient temperature setting is achievable with the burn-in system 10. In one embodiment, the controller 20 may be provided externally of the enclosure 12.

The fluid 26 may comprise air or any other suitable gaseous fluid. In one embodiment, the fluid comprises clean, dry air. The fluid 26 may be provided at about room temperature or at a higher or lower temperature depending on the temperature setting of the burn-in chamber 14. The flow of the fluid 26 into and out of the enclosure 12 provides convective heat transfer within the burn-in chamber 14, facilitating heat dissipation from the DUT 38 and heat distribution within the burn-in chamber 14.

The housing 30 may be made of a material that is able to withstand temperatures of up to about 250 degrees Celsius (° C.) such as, for example, Torlon®. The housing 30 is preferably made of a transparent material to allow visual monitoring of the burn-in process. In one embodiment, the housing 30 may have a length of between about 3 centimetres (cm) and about 8 cm, a width of between about 3 cm and about 8 cm, and a height of between about 3 cm and about 6 cm. It should however be understood by those of skill in the art that the present invention is not limited by the material from which the housing 30 is made or the dimensions of the housing 30.

In the embodiment shown, the base 32 of the enclosure 12 is configured to be mounted on the burn-in board 34 and to fit around a periphery of the burn-in socket 36. In the present embodiment, the base 32 is made of a thermally insulating material such as, for example, silicone to thermally isolate the burn-in system 10 from the burn-in board 34. This helps to prevent board surface degradation.

Figure 2:
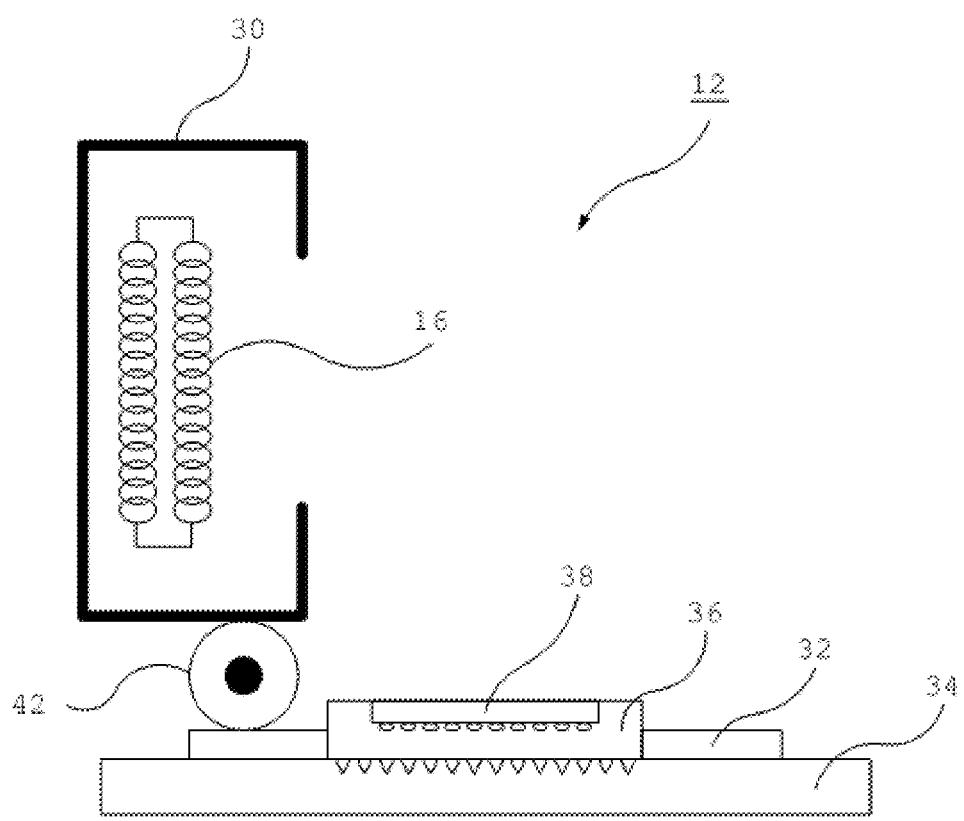
FIG. 2 is an enlarged cross-sectional view of an enclosure of the burn-in system of FIG. 1 in an open position.

Referring now to FIG. 2, an embodiment of the enclosure 12 of FIG. 1 is shown in an open position. In the embodiment shown, the housing 30 is pivotally coupled to the base 32 via a pivot joint 42.

The burn-in board 34 and the burn-in socket 36 are well known to those of ordinary skill in the art. Accordingly, detailed description thereof is not required for a complete understanding of the present invention.

Figure 3:
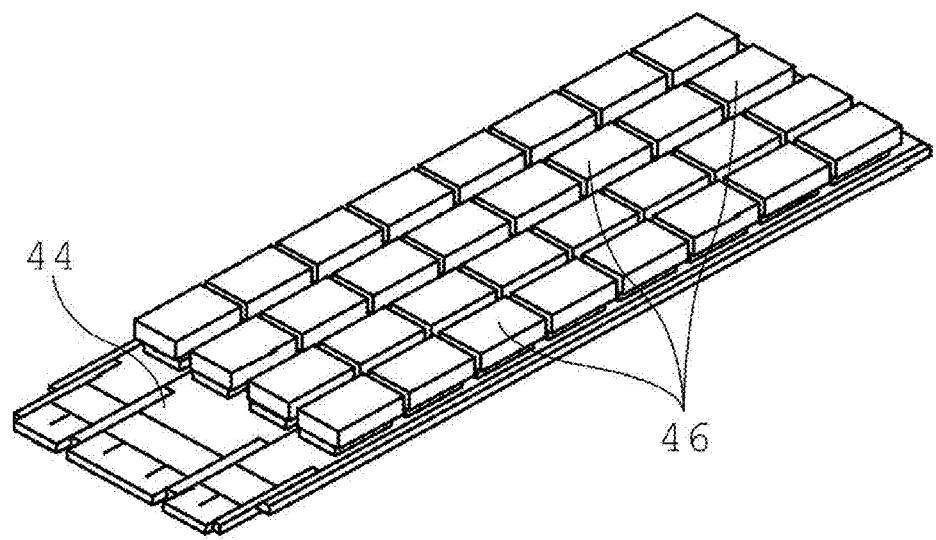
FIG. 3 is a top perspective view of a burn-in board with a plurality of burn-in ovens mounted thereon in accordance with an embodiment of the present invention.

Referring now to FIG. 3, a top perspective view of a burn-in board 44 with a plurality of the burn-in apparatus or ovens 46 mounted thereon is shown. Each of the burn-in ovens 46 may comprise elements of the burn-in system 10 described above with reference to FIG. 1. The temperature within the burn-in ovens 46 may be individually or centrally controlled.

As is evident from the foregoing discussion, the present invention provides a burn-in system that gives improved first-pass yields, reduces burn-in board degradation and that allows signal tapping with ease by creating a burn-in environment topically or locally around individual devices under test (DUTs) during burn-in testing.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

The invention claimed is:

1. A burn-in system for performing burn-in testing of a single semiconductor device among a plurality of semiconductor devices each mounted in a corresponding one of a burn-in socket of a plurality of burn-in sockets on a burn-in board, the system comprising:
    an enclosure defining a burn-in chamber, wherein the enclosure is configured to be mounted on the burn-in board over one of the burn-in sockets;
    a heating element within the burn-in chamber configured to generate heat within the burn-in chamber;
    a temperature sensor within the burn-in chamber configured to sense a temperature within the burn-in chamber;
    an opening in the enclosure for receiving a fluid;
    a controller configured to control the heating element and fluid flow into the enclosure in response to the temperature sensed by the temperature sensor; and
    wherein the enclosure comprises a housing pivotally coupled to a base, wherein the base is configured to be mounted on the burn-in board and to fit around a periphery of the one of the burn-in sockets.

2. The burn-in system of claim 1, wherein the housing is made of a transparent material.

3. The burn-in system of claim 1, wherein the base is made of a thermally insulating material.

4. The burn-in system of claim 1, wherein the enclosure is configured to be detachably mounted to the burn-in board.

5. The burn-in system of claim 1, wherein a nozzle is disposed in the opening.

6. The burn-in system of claim 1, wherein the fluid is provided at about room temperature.

7. The burn-in system of claim 1, wherein the fluid comprises air.

8. The burn-in system of claim 1, wherein the heating element is mounted to the enclosure.

9. The burn-in system of claim 1, wherein the temperature sensor comprises a resistive temperature sensor.

10. The burn-in system of claim 1, wherein the temperature sensor is mounted within the enclosure.

11. A burn-in apparatus, comprising:
    an enclosure defining a burn-in chamber, the enclosure comprising a housing pivotally coupled to a base, wherein the base is configured to be mounted on a burn-in board and to fit around a periphery of a burn-in socket, the burn-in socket for receiving a single semiconductor device to undergo burn-in testing and wherein the burn-in board includes a plurality of the burn-in sockets for simultaneously testing a plurality of the semiconductor devices;
    a heating element within the burn-in chamber configured to generate heat within the burn-in chamber;
    a temperature sensor within the burn-in chamber configured to sense a temperature within the burn-in chamber;
    an opening in the enclosure for receiving a fluid; and
    a controller configured to control the heating element and fluid flow into the enclosure in response to the temperature sensed by the temperature sensor, and
    wherein the burn-in board includes one or more probe points that are not covered by the enclosure and may be accessed during the burn-in testing.

12. The burn-in apparatus of claim 11, wherein the base is made of a thermally insulating material.

13. The burn-in apparatus of claim 11, wherein the enclosure is configured to be detachably mounted to the burn-in board.

14. The burn-in apparatus of claim 11, wherein the heating element is mounted to the enclosure.

* * * * *